(12) United States Patent
Boland et al.

(10) Patent No.: US 8,164,086 B2
(45) Date of Patent: Apr. 24, 2012

(54) PHASE-CONTROLLED FIELD EFFECT TRANSISTOR DEVICE AND METHOD FOR MANUFACTURING THEREOF

(75) Inventors: John Boland, Dalkey (IE); Stefano Sanvito, Dublin (IE); Borislav Naydenov, Dublin (IE)

(73) Assignee: The Provost, Fellows and Scholars of the Colege of the Holy and Undivided Trinity of Queen Elizabeth Near Dublin, Dublin (IE)

( * ) Notice: Subject to any disclaimer, the term of this patent is extended or adjusted under 35 U.S.C. 154(b) by 79 days.

(21) Appl. No.: 12/586,282

(22) Filed: Sep. 17, 2009

(65) Prior Publication Data

US 2010/0084631 A1    Apr. 8, 2010

Related U.S. Application Data

(60) Provisional application No. 61/192,433, filed on Sep. 17, 2008.

(51) Int. Cl.
*H01L 29/06* (2006.01)
*H01L 29/768* (2006.01)
*H01L 29/76* (2006.01)
*H01L 29/94* (2006.01)
*H01L 31/062* (2006.01)

(52) U.S. Cl. ......... 257/20; 257/224; 257/220; 257/345

(58) Field of Classification Search .......... 257/20, 257/133, 421, 40, 76, 194, 256, 13, 534, 257/341, 342, 345, 328, 327, 329, 335, 337, 257/391, 398, 400, 403, 404, 219, 220, 221, 257/224

See application file for complete search history.

(56) References Cited

U.S. PATENT DOCUMENTS

| | | | |
|---|---|---|---|
| 4,797,716 A * | 1/1989 | Chaffin et al. | 257/18 |
| 5,130,766 A * | 7/1992 | Arimoto et al. | 257/192 |
| 2004/0079939 A1* | 4/2004 | Taylor et al. | 257/40 |
| 2006/0275968 A1* | 12/2006 | Mantl et al. | 438/197 |
| 2008/0191196 A1* | 8/2008 | Lu et al. | 257/27 |
| 2009/0008634 A1* | 1/2009 | Tessler et al. | 257/40 |

OTHER PUBLICATIONS

Cespedes, O. et al., "Contact Induced Magnetism in Carbon Nanotubes," Journal of Physics: Condensed Matter, 16: L155-L161, 2004 (7pgs).
Ferreira, M. S. et al. "Contact-Inducted Spin Polarization in Carbon Nanotubes," Physical Review B 69:035407, 2004 (6pgs).

* cited by examiner

*Primary Examiner* — Chuong A. Luu
(74) *Attorney, Agent, or Firm* — Seed IP Law Group PLLC

(57) ABSTRACT

A phase controllable field effect transistor device is described. The device provides first and second scattering sites disposed at either side of a conducting channel region, the conducting region being gated such that on application of an appropriate signal to the gate, energies of the electrons in the channel region defined between the scattering centers may be modulated.

42 Claims, 7 Drawing Sheets
(5 of 7 Drawing Sheet(s) Filed in Color)

PHASE-CONTROLLED FIELD EFFECT TRANSISTOR DEVICE AND METHOD FOR MANUFACTURING THEREOF

CROSS REFERENCE TO RELATED APPLICATIONS

This application claims benefit under 35 U.S.C. 119(e) of U.S. Provisional Patent Application Ser. No. 61/192,433, filed Sep. 17, 2008 and entitled "Phase-Controlled Field Effect Transistor Device and Method for Manufacturing Thereof," which is incorporated herein by reference in its entirety.

BACKGROUND

1. Technical Field

The present specification relates to a phase controlled field effect transistor device and a method for manufacturing such a device.

2. Description of the Related Art

Present devices based on field effect transistors (FET) are typically gated through an oxide or high-K dielectric layer. During operation of such devices, the gate serves to open/close the channel between the source and drain. Leakage currents across the gate dielectric and the current between source and drain are limiting factors in determining the effective ON/OFF ratio of the device, as are the ability to precisely define the actual device dimensions at ever increasing levels of integration. Furthermore, known devices operate by sweeping charge into and out of the channel under the action of the gate, which then allows the movement of charge across the channel defined by the source and drain to charge and discharge a storage capacitor. The accompanying power dissipation and power management associated with device operation is the single biggest problem facing the electronics industry to date.

There are therefore a number of problems with FET devices that need to be addressed.

BRIEF SUMMARY

These needs and others are addressed by a device in accordance with the teachings of the embodiments of the invention which provide a phase controllable field effect transistor device which provides first and second scattering sites disposed at either side of a conducting channel region, the conducting region being gated such that on application of an appropriate signal to the gate, energies of the electrons and the phase of the wavefunction associated with these electrons in the channel region defined between the scattering centres may be modulated.

Accordingly a device as claimed in claim 1 is provided. Advantageous embodiments are provided in the dependent claims. A method of providing such a device is also provided.

These and other features and advantages will be better understood with reference to the exemplary embodiments which follow which are provided to assist in an understanding of the teaching of the embodiments of the invention and are not to be construed as being limiting in any way whatsoever.

BRIEF DESCRIPTION OF THE DRAWINGS

The patent or application file contains at least one drawing executed in color. Copies of this patent or patent application publication with color drawings will be provided by the Office upon request and payment of the necessary fee.

Embodiments of the present invention will now be described with reference to the accompanying drawings in which.

DETAILED DESCRIPTION

Figure 1:
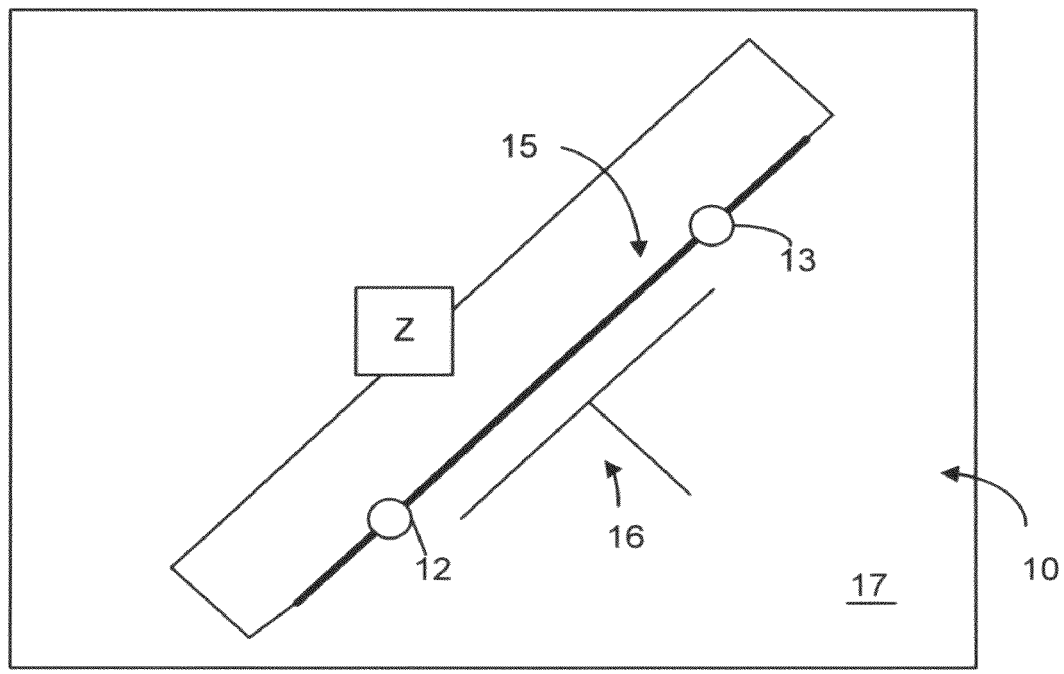
FIG. 1 is a schematic view of a molecular device according to an embodiment of the present specification wherein a one-dimensional conductor upon which scattering centres have been placed at a precisely controlled separation is provided, the energies of the electrons in the channel region defined between the scattering centres being capable of modulation by the application of a field to a proximal gate.

Referring to FIGS. 1 to 6 of the accompanying drawings and initially to FIG. 1, a nano-dimensioned phase-controlled field effect transistor (FET) device 10 is provided. The device 10 comprises a conductor 11 and has first and second scattering sites 12, 13. The conductor 11 is formed from a conducting material and is of the type that possesses a long electron wavefunction coherence length. The scattering sites 12, 13 are positioned relative to one another to be within said electron wavefunction coherence length so as to define a conducting channel region 15. The conducting material is homogeneous in nature and the scattering sites while providing localised modification of how electrons propagate within the conducting material do not effect a break in the conducting material such that the conducting material is continuous through at least one of the scattering sites. The scattering sites may be considered as providing local perturbations to the conducting performance of the conductor in the regions of the scattering sites. A gate 16, desirably provided proximal to the conducting channel 15, may be used to switch the device. In this way it will be appreciated that when compared to a conventional FET, that the first and second scattering sites are analogous to the source and drain of the FET, the conducting channel 15 is the channel of the FET and the gate 16 provides the gate functionality of a conventional FET although its operation is completely different and not dependent on the movement of charge.

The scattering sites are strategically located and configured to provide a standing wave between incident and scattered electrons and oscillations in the electron transmission coefficient. The conductor 11 may be a 1-dimensional conductor (1-D), for example, a 1-dimensional wire, a carbon nanotube, typically in the form of a defect free Single Walled Nanotube (SWNT). The conductor 11 may be provided on a substrate 17 such as provided by a SiO2 substrate. The substrate 17 may have a pre-patterned gate 16 formed thereon, in which case the conductor 11 may be positioned, deposited or grown substantially parallel to the gate to form a gated region and the scattering sites 12, 13 may be formed on the conductor by probe manipulation to locate them either side of the gated region. The scattering sites 12, 13 may be molecules, metallic clusters or the like and function like a barrier within the device so as to affect the propagation of electron waves along the conductor. The scattering sites could be provided so as to encapsulate the conducting material, for example defining an aperture through which the conducting material passes therethrough. In the locality of the scattering sites perturbations in the conducting performance of the conductor may be effected. By providing first and second scattering sites separated from one another by the conductor, a standing wave between incident and scattered electrons and oscillations in the electron transmission coefficient may be provided within the conductor. Further examples of the type of structures that could result in barriers or scattering sites include those resultant from controlled etching, from formed defects or lithographically or SPM delineated nanometer scale lines (metal or semiconductor) written across the one dimensional channel at the required locations. It will be appreciated that the conductor and scattering sites are typically separately formed and are not provided as an integral component to the device.

The gate field applied to the channel between the scattering sites is controllable. The impedance (Z) of the conductor 11 may be measured, as shown in the example of FIG. 1, in the presence and absence of a gate field applied between the scattering sites.

In use, the electron waves in the 1-D conductor scatter off the barrier provided by the scatterers and set up standing waves that modulate the zero-bias conductance of the device 10. By changing the gate voltage, the transmission T at zero bias can be switched from high to low values to provide a large on/off ratio. By controlling or sweeping the bias voltage it is possible to change the conductance of the device, in that the conductance of the device is controllable by corresponding control of the bias voltage as provided by the gate 16. In this way by controlling the bias voltage, it is possible to switch the device 10 from the on to the off state, as required.

The device described is essentially quantum mechanical in nature and is configured to exploit the phase of the electron wavefunction rather than the current flow. Thus, when operated in the zero-bias limit, it is noted that no charge actually flows in these measurements either in the action of the gate or the motion of charge across the channel so there is no dissipation or energy loss, apart from leakage between the gate and the channel which can be reduced arbitrarily.

Barrier/Scattering Site Properties

As noted above, the scattering sites 12, 13 may comprise molecules or metallic clusters. The metallic clusters may comprise magnetic materials. Scatterers or scattering sites may be provided having a very low transmission factor and as such are configured to provide a device having a maximized on/off ratio. Coupling between any necessary electrical leads or contacts and the centre channel region 15 may be controlled to a significant degree to avoid unwanted Coulomb blockage or discrete charging effects.

For a two scatterer device, it will be understood that the device on/off ratio is provided in a relationship of the form $(2-T)^2/T^2$ where T is the transmission coefficient for a single scatterer. This means that the transmission across a single scatterer should be relatively small in order to provide a valuable on/off ratio. This however will be appreciated as not being a stringent requirement, in that for example $T=1/2$ already provides an on/off ratio of 9.

The scattering site may be formed on the surface of the conductor. This can be provided in a number of different fashions such as for example by direct chemical reaction or by chemically etching and removing material from the wire system. Scattering sites may be formed or fabricated either side of the gated region. This can be accomplished by a range of techniques such as:

STM or AFM probe assisted physical manipulation and deposition of materials and molecules at the target location on the conductor;

use of precisely focussed electron and ion beams to produce localised defects or etchpit formations that are subsequently the sites of selective chemical reaction or materials deposition;

electron and/or ion beam assisted lithography to deposition nanoscale lines that intersect the conducting channel at prescribed locations, the use of imprint lithography to either transfer materials or to define patterns on the length scale of the channel to assist in the deposition of scattering centres, template methods that allow deposition of materials transfer at the prescribed location using for example nanoporous template materials such as AAO, meso-porous materials or inverse opal techniques, controlled deposition of metal scatterers which provides a route to wafer scale processing and manufacturability. These scatterers can also be written as perpendicular lines using advanced e-beam or other nanoscale lithographies. Each of the provided scatterers may have the same or different characteristics depending on the desired application.

It will be appreciated that depending on the nature of the scatterer that it may be considered either an active or a passive scatterer. Passive scatterers are those such as provided by etchpit formations and serve to disrupt the flow of charge along the 1D conductor—so as to form a simple barrier. Active scatterers in contrast will typically have energy levels within the operation window of the device, and could provide more functionality in the form of, for example, modified magnetic effects to the devices. Indeed by employing such active scatterers in the form of for example magnetic clusters it is possible to bias the scatterers independently of the bias applied to the gated region. In this way such magnetic clusters could be used to provide a magnetic interferometer, i.e. a device whose output is affected by the presence of an external magnetic field or a device which provides a source of spin-polarized current.

The scattering phase of the electronic state confined between the scattering sites is desirably monotonic with the k-vector. This is better achieved in 1-D channels where there is no beating between the wave-functions associated to closely spaced transverse waves.

It will be understood however that devices provided in accordance with the present teaching could easily go in the Coulomb Blockade regime. It will be appreciated therefore that T should preferably be in the region of >0.1. It will be understood that the specifics of this value will depend on the size of the channel between the scatterers and its dielectric constant.

In general typical requirements for such devices include the feature that level spacing in the region defined by the scattering centres should be larger than kT. It will be understood that the condition for conductance switching is: $\Delta E > \Gamma > kT$ where $\Delta E$ is the typical level spacing between the standing waves (depending on the separation between the scattering centres) and Γ is the energy broadening of the resonant level in the on-state (depending on the strength of the coupling between the channel and the scattering centres). The condition necessary to avoid Coulomb blockade is Ec<<Ekin, i.e. the kinetic energy Ekin should dominate the Coulomb energy Ec. The actual value of these parameters will be appreciated as being system dependent and it is not intended to limit the application of the teaching of the embodiments of the present invention to any one set of parameters or values. The conductor may be provided to have only a limited number of conducting channels 15, preferably only one. By limiting the number of conducting channels a device so configured will minimise scattering to or from different channels which could result in more complex interference patterns.

As was mentioned above the scattering sites or centres comprising metallic clusters may be comprised of magnetic material. The scattering centres may be configured to enable tuning of the energy levels therein. The tuning of the scattering sites may be based on control of the resonant effects of the device in conjunction with the magnetic properties of a scattering centre. A bias or gate may further be provided to one or more of the scattering centres to as to selectively affect the metallic or magnetic nature of these scattering centres. A gating of the scattering site/centre enables control of the potential profile and thus may be used to effect changes in the transmissivity thereof. Since the on/off ratio and two-molecule device transmission depends on that of the single-molecule device, this gives an extra element of tuning. This tuning can be done in conjunction with or independently of the gating provided by the gate 16 proximal to the channel 15. The gate operation at the scatterers effectively changes the value of k at the Fermi energy by a shift in the electrostatic potential and hence the phase of the electron standing wave in the channel. Any phenomenon that causes a shift in k Fermi provides means to switch the device, including:

Changes in effective mass (magnetic field)
Materials where the bandstructure is highly strain sensitive
Materials with high spin-orbit coupling and/or peculiar Fermi surface (semi-metals).
Conductor/wire materials/properties The conductor 11 is preferably provided in the form of a 1-dimensional (1-D) wire, or for example may be provided by a carbon nanotube. It will be appreciated that the teaching is not intended to be limited to such 1-D structures or configurations in that other 2-dimensional (2-D) materials could also be utilised. If provided in the form of a semiconductor wire any one of a number of different semiconductors such as for example Si, Ge, GaAs etc., may be used.

The performance of the device depends on the Fermi wavelength of the material of the conductor 11 and how this compares with the physical length of the channel and the elastic and inelastic mean free paths. It will be appreciated that 1-D behaviour means that the channel cross section must be of the order of the Fermi wavelength and the size of the scattering centre should also be significantly smaller than the Fermi wavelength It will also be understood that the Fermi wavelength is material dependent. It ranges from several 10's of nm for conventional semiconductors to less than 1 nm for carbon nanotubes. Thus these effects are seen with semiconductors particularly those with large unit cells and low electron densities, e.g. GaAs, Si, Ge or Si/Ge.

In the exemplary arrangement of FIG. 1, the device 10 comprises a carbon nanotube conductor 11 provided on a SiO2 substrate 17. The substrate 17 comprises pre-patterned gates 16 having a length of the order of 100 nm. Since the coherence length in carbon nanotubes is upward of 1 μm, this provides significant flexibility in terms of fabrication of the device. For example, the carbon nanotube can be manipulated so as to be provided in an orientation substantially parallel to the gate 14 and a pair of sub-nm metallic clusters may be positioned by probe manipulation as scattering sites 13, 14 either side of the gated region. The performance of the device may assessed by measuring the conductance of the tube 11 as a function of gate bias. Critically, the gate alters the apparent resistance of the nanotube so that very little current is dissipated in switching the tube from a low to a high state.

In 1-D systems such as this, the electrons are capable of travelling large distances without scattering so that the coherence length of the electron wavefunction is very large. Thus it is possible to consider these as pure quantum systems. The devices described in the present specification may be configured for operation in several dimensions, namely 1-D and 2-D, the additional dimension adding additional functionality and complexity. In 2-D, the conductor may comprise a material such as graphene. A 2-D array of scattering sites may be formed thereon. By placing proximal gate electrodes in the channel regions between the scatterers it is possible to modulate the conductance across the entire graphene sheet. Significantly, in the 2-dimensional embodiment, the device or switch comprises a number of levels, since each channel can be turned on or off independently of the others.

This multilevel switch is advantageously dissipation free and compatible with high levels of integration. In a 2-D system such as graphene where large coherence lengths exist in both dimensions, scattering sites may be positioned using nanoscale deposition or surface modification. In such arrangements it is desirable that when provided that they should form a regular 2-D array.

In providing such a 2-D system it will be appreciated that it is important to position the proximal gates between the scatterer sites without adversely affecting the properties of the graphene sheet. When achieved properly it is possible to independently modulate the different gates to produce a multi-level switch. An exemplary technique that may be employed to achieve this is for example by patterning the gates on a thin dielectric film that support the graphene sheet. Such a configuration can be achieved by using a silicon on insulator (SOI) substrate that is etched to removed the Si beneath the graphene sheet and subsequently patterned to form the gate structure.

Figure 2:
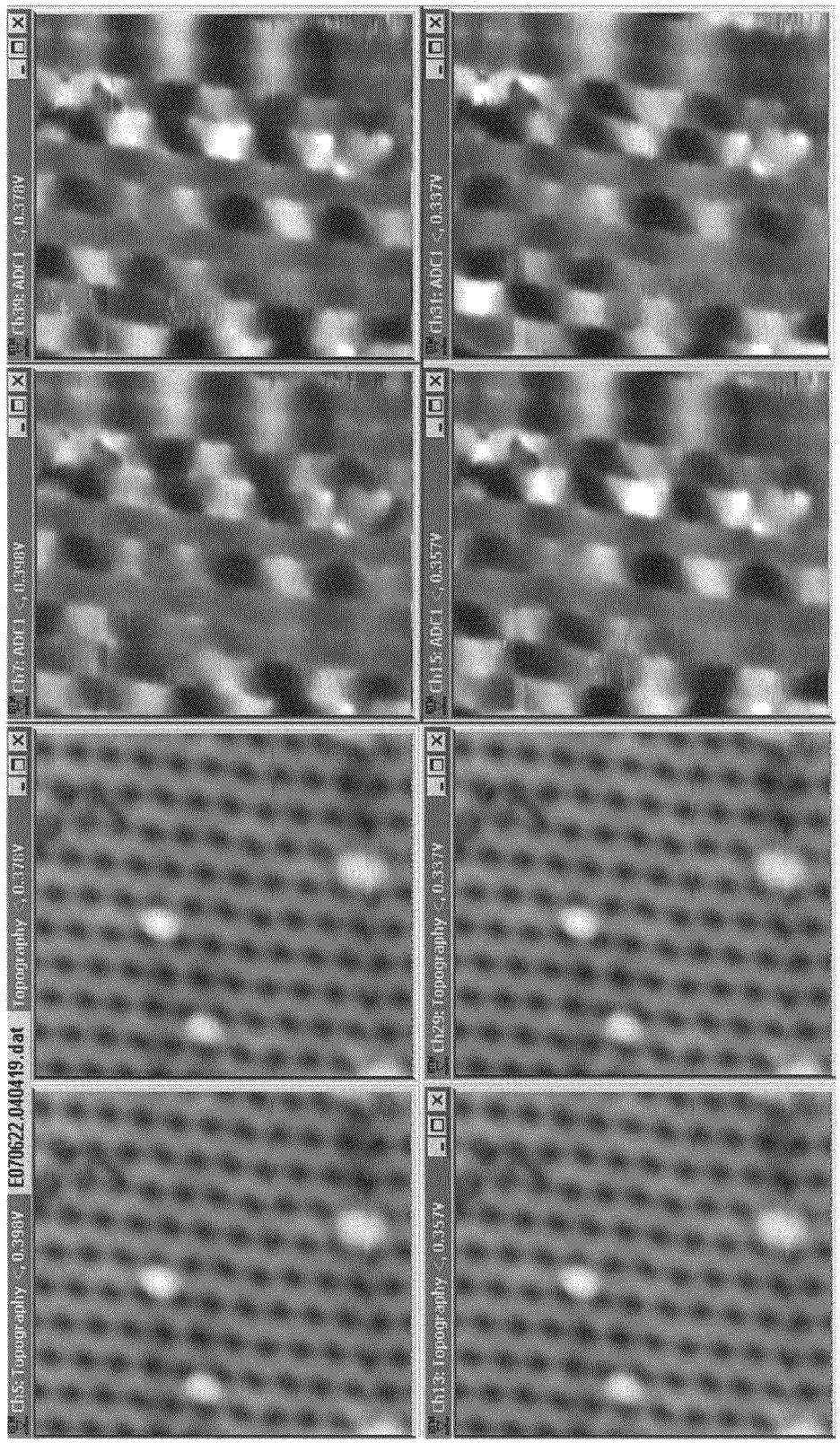
FIG. 2 is a series of images, of which the four left hand image panels show Si(100) substrate on which scattering sites (white protrusion) have been placed, the four right hand image panels show the conductance of the surface.

Referring to FIG. 2 an exemplary embodiment is shown in which scattering sites are formed on a Si (100) surface. The Si (100) surface is comprised of dimer rows that each behave as quasi-1-D systems and therefore as one dimensional conductors. Such a 1-D system provides a demonstration of the operation of a phase device as provided by the present teaching. Scattering sites comprising benzene molecules are formed thereon. The four left hand panels show Si (100) on which scattering sites (white protrusion) have been placed. The scattering sites are clearly shown in the conductance images (the four images on the right hand side of FIG. 2). The presence of surface waves emanating along the dimer rows and away from the scattering sites will be noted. Each panel recorded at different electron energy but such effects extend down to the Fermi energy where the zero-bias conductance can be measured.

It will be understood that these scattering sites may be fabricated by deposition or local modification, i.e. any controlled irregularity that causes the electrons to scatter.

Figure 3A:
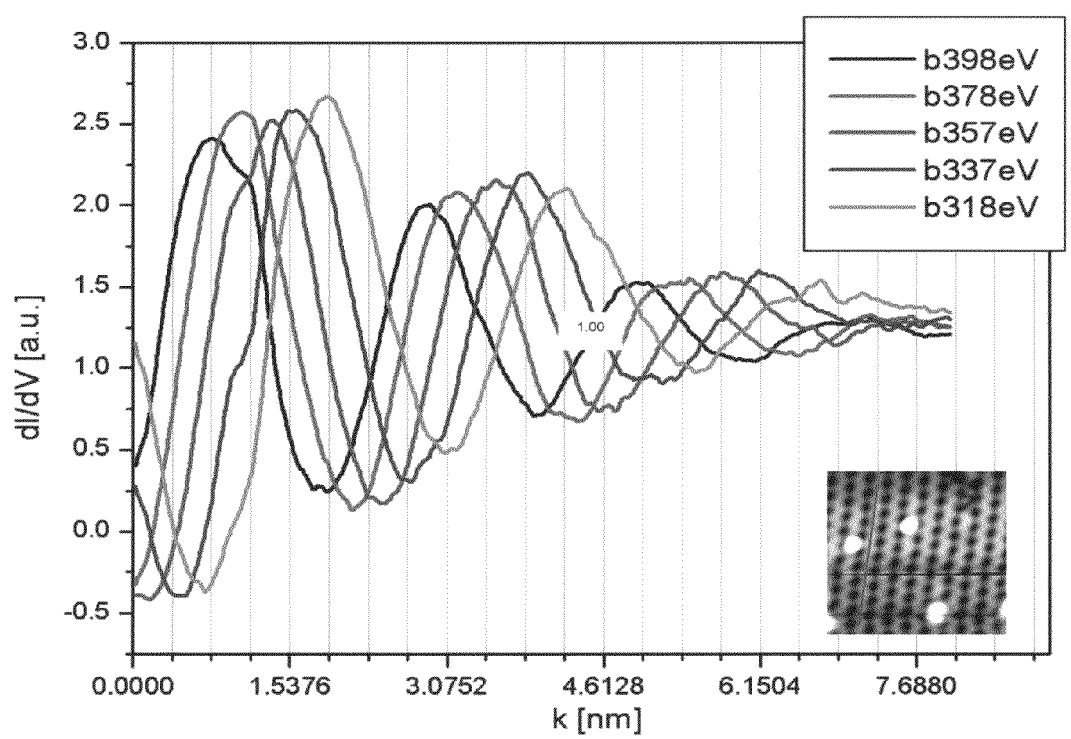
FIG. 3A is a graphical illustration of electron standing waves at different energies on the Si(100) substrate of FIG. 2
Figure 3B:
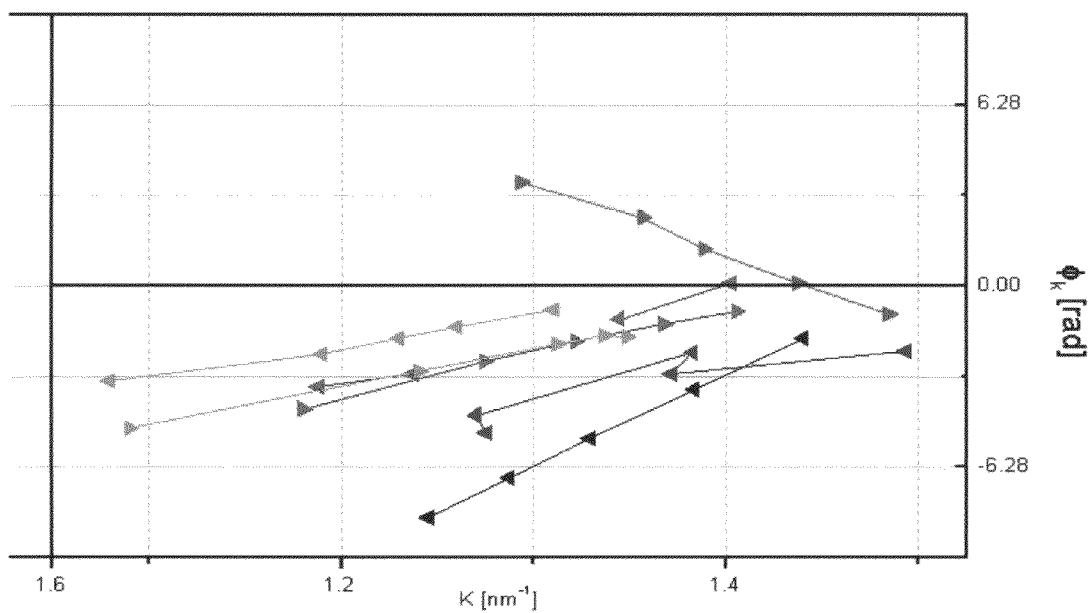
FIG. 3B shows the relative dependence of the phase shift $\phi$ as a function of the wave k vector.
Figure 4:
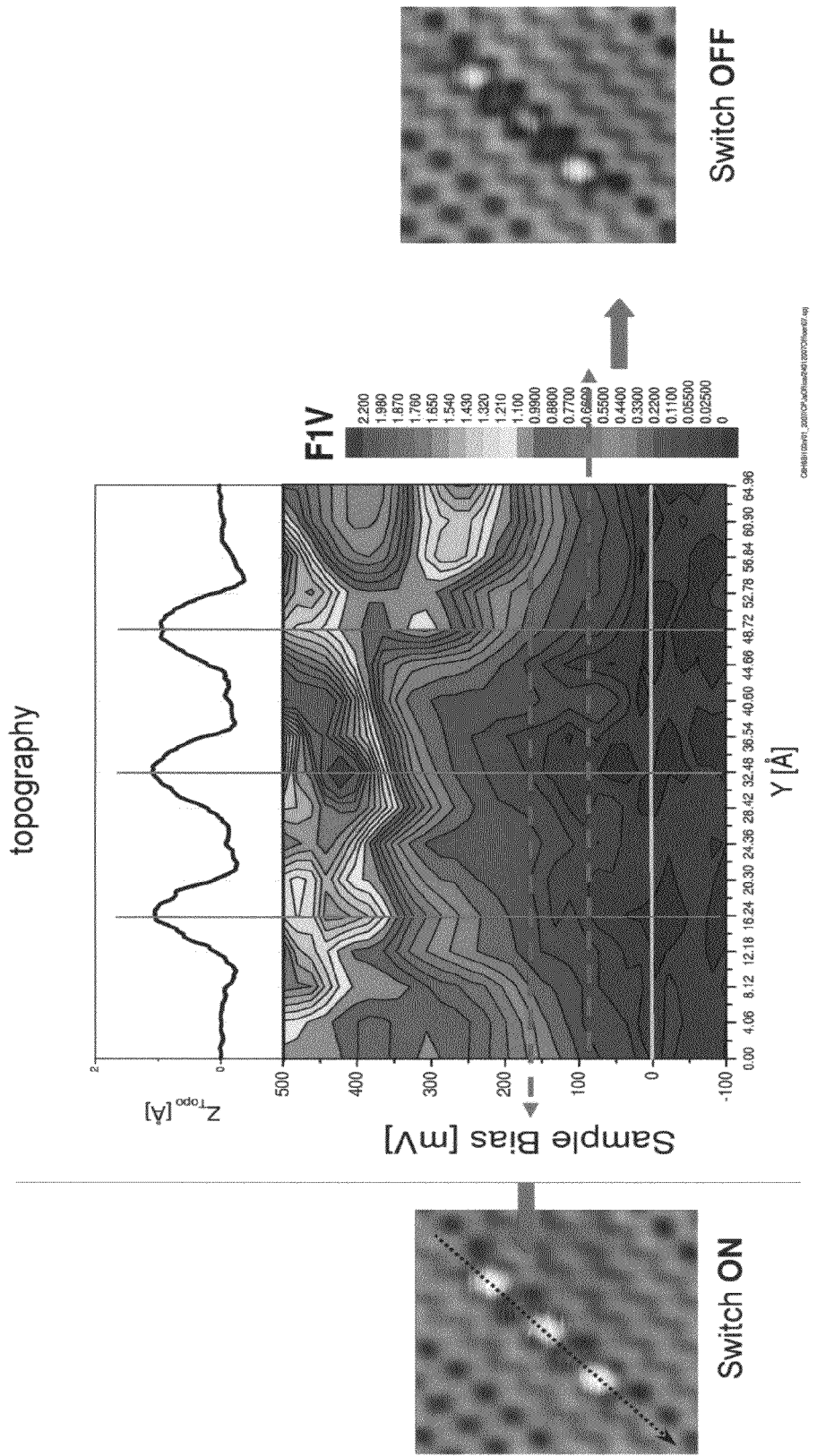
FIG. 4 shows images of three benzene molecules positioned on a single quasi-1D Si(100) dimer wire under different bias conditions.
Figure 5:
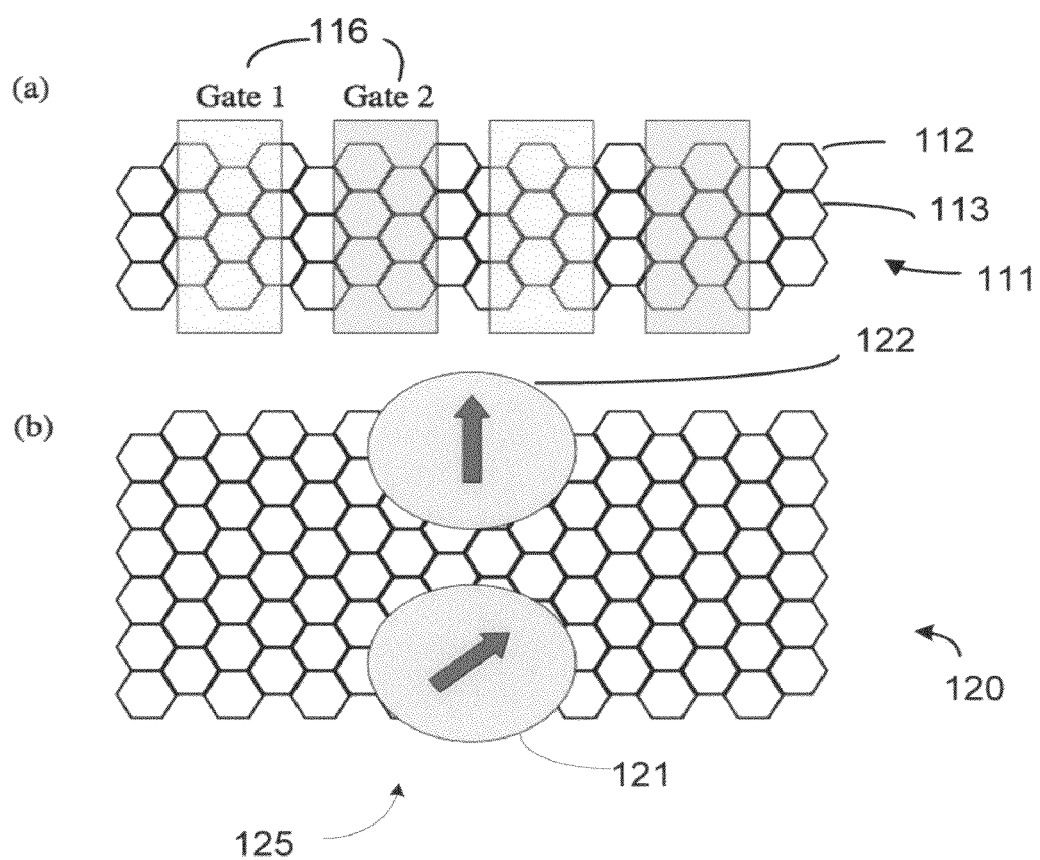
FIG. 5 shows representations of multi-level switching devices based on graphene with FIG. 5(a) showing a periodic array of gates that can be switched independently by having gates 1 and 2 controlled differently and FIG. 5(b) showing a magnetic interferometer type device, in which current depends in general on the mutual orientation of the magnetization vectors of two magnets placed on top of the conducting channel (the magnetization is in shown with the arrow lead line).

The scattering amplitude along each dimer row was analysed and modelled as shown in FIG. 3. A detailed analysis reveals that the scattering phase depends linearly on the value of the k-vector. FIG. 3(*a*) is a graphical illustration of electron standing waves at different energies on Si (100) and FIG. 3(*b*)

shows the relative dependence of the phase shift φ as a function of the wave k vector. It will be appreciated from inspection that by changing the energy that the frequency and phase of these scattered waves change in a predictable manner. A similar change can be induced by changing the voltage applied to a proximal gate as this causes a change in the k-vector of the electrons in the system, and in particular to the electrons at the Fermi energy that control the zero bias transmission along the one dimensional system. For example, by changing the gate voltage, the transmission T at zero bias can be switched from high to low values to provide an on/off ratio of several order of magnitude. It is noted that in contrast to conventional charge based FET operations that the actual magnitude is not as important as there is no current flow in the channel even when the device is in the ON state and any leakage across the gate dielectric can be controlled using high k dielectrics as in conventional CMOS devices.

FIGS. 4a and 4b show an embodiment in which three benzene molecules are positioned on a single quasi-1-D Si (100) dimer wire under different bias conditions. At high bias all three molecules are equivalent but at lower bias there is a sharp reduction on the LDOS at the central position. Therefore by changing the bias, which is equivalent to applying a gate voltage, it is possible to open and close a conductance channels along the wire. This is evident from an inspection of the bias condition in FIG. 4a where all three benzene atoms appear equivalent, whereas at the bias in FIG. 4b the central molecule shows a dramatically reduced intensity. Under the conditions in FIG. 4b there is very little charge at the centre position thereby pinching off the existing conductance channel associated with the Si dimer row and hence the conductance of the wire under this condition is very low, i.e. the switch is in the OFF position. It will be understood therefore that by changing the bias, which is equivalent to applying a gate voltage, it is possible to open and close conductance channels along the wire; and since the system is one dimensional it is possible to modulate the transmission properties of the entire wire. Therefore it will be understood that a change in the applied gate voltage results in a dramatic change in the resistance or impedance of the wire. By changing the gate voltage the transmission T at zero bias can be switched from high to low values provide an on/off ratio of several order of magnitude. The actual magnitude provided will depend on the detailed properties of the scattering centres and can be controlled as desired.

Referring to FIGS. 5(a) and 5(b) multi-level switching devices 110 based on graphene are described. By positioning proximal gates 116 on a narrow strip (30-50 nm) of the conductor graphene 111 (as defined by focussed ion-beam milling or lithographical etching of a graphene sheet) it is possible to define an array (in either 1-D or 2-D) of scattering centres/sites 112, 113 whose inter-channel regions can be gated independently. In the first example of FIG. 5(a) a periodic array of gates that can be switched independently is shown (gates 1 and 2 are controlled differently). This configuration allows for changing of the period of the super-gate, i.e. the periodicity of the superlattice defined by the gates themselves and also allows for a tuning of the energy levels. In a modification to that illustrated, the provision of additional scatterers whose properties may be independently controlled might offer additional flexibility. For example in the case of three scatterers, even if they are not precisely positioned to produce the same level spacing in the two channel regions, by independently tuning the applied bias to the respective gates, it is possible to bring the channel into a resonance condition that will allow multi-level switching but enhanced on/off ratios.

Referring to FIG. 5(b) a magnetic interferometer device 120 is illustrated, in which current depends in general on the mutual orientation of the two magnets 121, 122 placed on top of the conducting channel 125 (the magnetization is in shown in the arrow configuration). Assuming the two nanomagnets have different cohercive fields they can be switched at different field strengths. The possibility of inducing a magnetic moment on a carbon nanotube by proximity with a magnetic substrate has been already demonstrated both theoretically [Phys. Rev. B 69, 035407 (2004)] and experimentally [J. Phys.: Conden. Matter. 16, L155 (2004)], and this can be usefully employed within the present teaching. It will be further understood that the spatial extension of the region of carbon-based material as modified by proximity with a ferromagnet is limited by the screening length in the carbon material or by its spin-diffusion length, whatever is the shorter.

Figure 6:
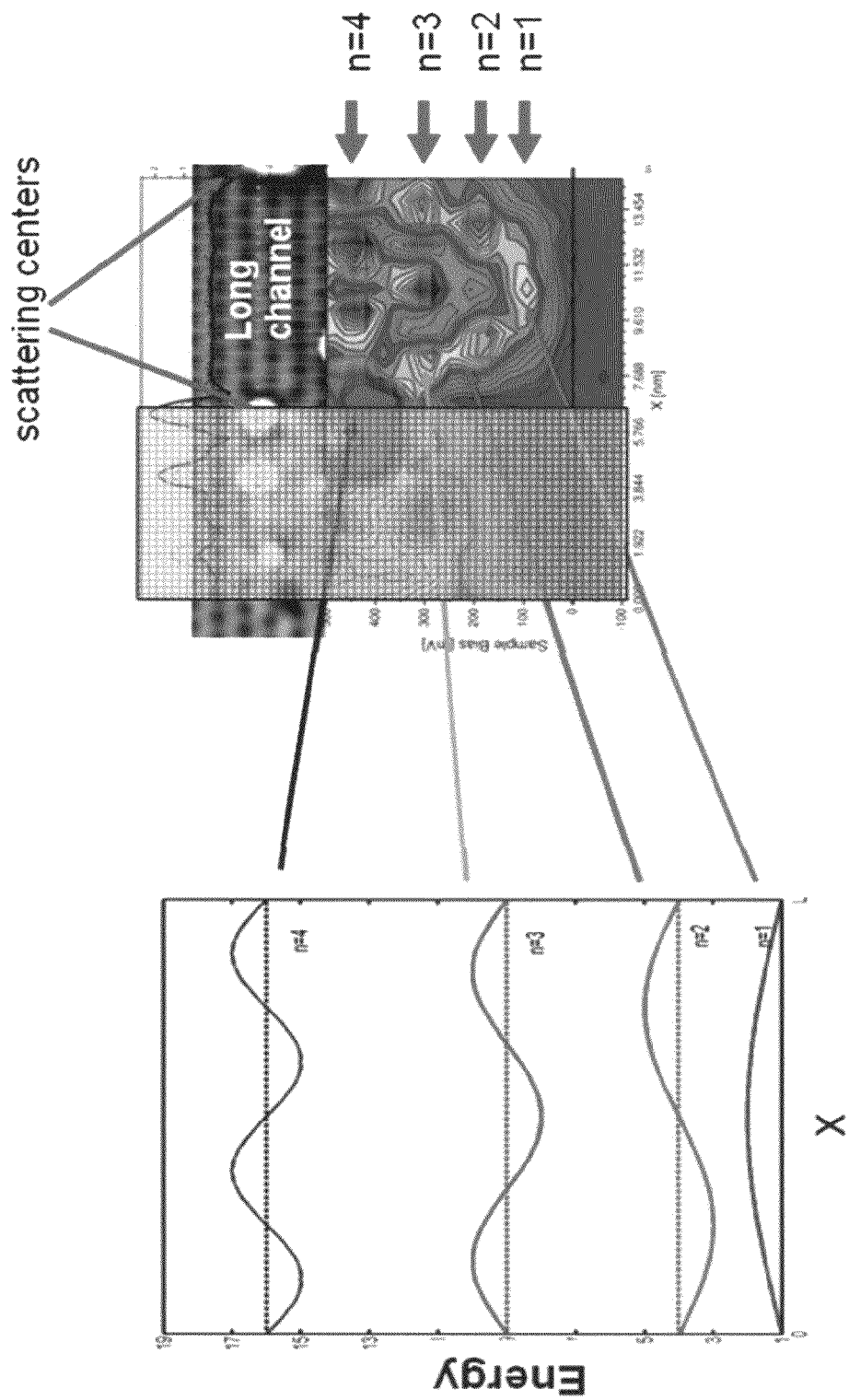
FIG. 6 shows the wavefunctions for different size channel lengths as derived from experimental data.

FIG. 6 shows results from experimental data where the scatterers are provided in the form of metal clusters deposited using an STM probe. In accordance with the teaching of the embodiments of the present invention, examination of the wavefunctions for different size channel lengths show that the zero energy and energy spacing shift in a predictable manner.

The energy levels shown for each channel are computed using the formula:

$$E(n) = \frac{n^2 h^2}{8mx^2}$$

Where E(n) is the energy level at a particular channel
n is the channel
h is the Planck constant
m is the electron effective mass
x is the conductor length Method for Manufacturing A method is provided for manufacturing a phase controlled field effect transistor devices as described in the present specification. Such a method will employ the provision of scattering sites or centres onto a conductor. The scattering sites are located within the electron wavefunction coherence length of the conductor, to provide the required scattering.

Materials

Some of the main considerations in the manufacture of a device having particular performance/ output characteristics include the selection of conductor and scattering sites/configurations and materials. As was mentioned above the conductor may comprise a 1-dimensional or 2-dimensional conductor. The conductor may be positioned on a substrate comprising a pre-patterned gate to form a gated region. In an alternative arrangement as the gate is relatively easy to define, the gate region may be deposited after positioning of the scattering centres to ensure that the gating action is precisely controlled and limited to the channel region.

The first and second scattering sites formed on a conductor at a channel may be the same or different, depending on the requirements. Scatters of different size may be selected or indeed may be provided from different materials. Similarly, one or both of the scattering sites may comprise a magnetic material.

As will be appreciated from the discussion above, the location of the scatter sites relative to the conductor is controllable and/or selectable to provide a device as required. Heretofore the 1-D and 2-D conducting materials have been described with reference to nanotubes, 1-D nanowires and graphene sheets or layers. In another embodiment the 1-D conductor or 2-D layers may be formed using semiconductor heterojunction techniques deposited using conventional molecular beam epitaxy (MBE) methods. For example a 1-D system can be established by growing/depositing a 1-D GaAs channel in an AlGaAs substrate. In such an example, the smaller bandgap of GaAs compared to AlGaAs results in confinement within a channel region, which could be gated as discussed above. Other material combinations are possible, and in general the properties of the wires can be tuned using well established band engineering techniques. By appropriately doping either the GaAs or the AlGaAs or both it is possible to provide carriers in the channel in the form of either electron or holes.

It will be appreciated that by employing such approaches advantages derived from the dimensions of the Fermi wavelength in compound semiconductors can be utilised. In such materials the Fermi wavelength is very large which means that channels with cross section on the order of 10 nm or more (which are easily fabricated using electron beam lithography or templating methods) are effectively 1-D in nature. They also have the advantage that the confinement is essentially a bulk phenomenon (in contrast to carbon nanotubes) such that passivation of the channel (following deposition of the scattering centers) will not impede the operation of the device and indeed will render it more robust and less susceptible to environmental influences.

The scattering centers can be fabricated using the methods described earlier, or by selective etching, doping or surface chemical functionalisation of appropriately spaced regions of the 1-d channel.

Advantages

The devices and method of the specification address the provision of next generation devices at higher integration densities and dramatically reduced power consumption levels. There are no prior art quantum devices that are viable solutions at present. The present specification provides a phase controlled FET type device which has the advantage of being easy to fabricate in comparison with alternative devices and which shares in common many processes and materials that are already commonly used in conventional FET/CMOS device processing. The devices described herein advantageously do not involve the motion or dissipation of charge. As such the devices may advantageously be integrated to very high densities and with reduced cost of operation. While the devices of the various embodiments of the present invention have been referred to as a FET, it will be appreciated that this is an analogy to a classical FET. In such a classical FET the gate operation pushes charge in and out of the channel region and turns the device on and off. In the phase devices provided in accordance with the present teaching no charge actually moves, the gate action changes the phase of the electron wave in the channel region, so therefore while the devices have been described as FETs it will be appreciated that this description is purely to assist in an understanding of the functionality of components of such devices.

The words comprises/comprising when used in this specification are to specify the presence of stated features, integers, acts, steps or components but does not preclude the presence or addition of one or more other features, integers, acts, steps, components or groups thereof.

All of the U.S. patents, U.S. patent application publications, U.S. patent applications, foreign patents, foreign patent applications and non-patent publications referred to in this specification including, but not limited to: Phys. Rev. B 69, 035407 (2004) and J. Phys.: Conden. Matter. 16, L155 (2004), are incorporated herein by reference, in their entirety and for all purposes. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A phase controllable field effect transistor device switchable between on and off states, the device comprising:
   a conductor formed from a conducting material and having a channel region defined between at least two scattering sites, the scattering sites being separated from one another by a distance less than the electron wave function coherence length of the conducting material and wherein the conducting material continues through at least one of the scattering sites to a region outside the channel region,
   a gate provided proximal to the channel region and configured to operably provide a bias voltage to the channel region to modulate a scattering phase of electrons within the channel region such that the zero bias conductance of the device may be modulated to switch the device between the off and on states.

2. A device as claimed in claim 1 wherein the scattering phase is a smooth varying function of the k-vector of the electrons within the channel region.

3. A device as claimed in claim 1 wherein the conductor comprises a one-dimensional conductor or wire.

4. A device as claimed in claim 1 wherein the conductor comprises a nanotube.

5. A device as claimed in claim 1 wherein the conductor comprises a 2-dimensional material.

6. A device as claimed in claim 5 wherein the conductor is provided in the form of a graphene sheet or layer.

7. A device as claimed in claim 1 wherein the scattering sites are formed at locations relative to one another such that operably a standing wave between incident and scattered electrons and oscillations in the electron transmission coefficient (T) is provided within the channel region.

8. A device as claimed in claim 1 wherein the bias voltage is controllable to switch the electron transmission coefficient (T) at zero bias from high to low values and the device is configured to provide an on off ratio of several orders of magnitude.

9. A device as claimed in claim 1 wherein for a two scattering site device the device on/off ratio has a relationship of the form $(2-T)^2/T^2$ where T is the transmission coefficient for a single scattering sites and the two scattering sites are assumed to be identical.

10. A device as claimed in claim 1 wherein at least one of the scattering sites comprises a controlled irregularity that operably causes electrons in the channel region to scatter.

11. A device as claimed in claim 1 wherein at least one of the scattering sites has dimensions less than the Fermi wavelength of the material of the conductor.

12. A device as claimed in claim 1 wherein the channel region has a cross-sectional area of the order of the Fermi wavelength of the conducting material of the conductor.

13. A device as claimed in claim 1 wherein at least one of the scattering sites is provided by a molecule.

14. A device as claimed in claim 1 wherein at least one of the scattering sites is provided by a metallic cluster.

15. A device as claimed in claim 1 wherein at least one of the scattering sites comprises a magnetic material.

16. A device as claimed in claim 15 wherein magnetic properties of the scattering sites may be biased independently of any applied gate bias to the channel region.

17. A device as claimed in claim 16 wherein the scatterers are provided in the form of perpendicular metals.

18. A device as claimed in claim 1 wherein at least one of the scattering sites is provided by an etchpit formation.

19. A device as claimed in claim 13 wherein the molecule has resonance states that can couple into states in the channel.

20. A device as claimed in claim 15 wherein the scattering site comprising a magnetic material is configurable to enable tuning of the energy levels therein.

21. A device as claimed in claim 20 wherein the tuning of the scattering site is based on control of the resonant effects of the device in conjunction with the magnetic properties of the scattering centre.

22. A device as claimed in claim 1 wherein a bias voltage or gate is provided to one or more of the scattering sites in addition to the channel gate bias.

23. A device as claimed in claim 22 wherein control of the bias applied to the scattering site provides means for controlling the potential profile and transmissivity of said scattering site.

24. A device as claimed in claim 22 wherein control of the bias applied to the scattering site provides for control of the value of k at the Fermi energy by a shift in the electrostatic potential.

25. A device as claimed in claim 1 wherein the value of k at the Fermi energy is controlled by providing a change in effective mass and/or by use of materials in which the bandstructure is highly strain sensitive and/or by use of materials with a high spin orbit coupling and/or peculiar Fermi surface.

26. A device as claimed in claim 1 wherein at least one of the scattering sites is formed by controlled adsorption on the conductor.

27. A device as claimed in claim 1 wherein at least one of the scattering sites is formed by controlled deposition on the conductor.

28. A device as claimed in claim 1 wherein at least one of the scattering sites is written as a line using e-beam or nanoscale lithography.

29. A device as claimed in claim 1 wherein at least one of the scattering sites is formed by surface modification of the conductor.

30. A device as claimed in claim 1 wherein the conductor is provided on a substrate.

31. A device as claimed in claim 30 wherein the substrate comprises one or more pre-patterned gates.

32. A device as claimed in claim 31 wherein the gates have dimensions of the order of 100 nm.

33. A device as claimed in claim 30 wherein the substrate comprises a $SiO_2$ substrate.

34. A device as claimed in claim 30 wherein the conductor is provided on the substrate so as to be orientated substantially parallel to the gate.

35. A device as claimed in claim 1 wherein the conductor comprises a 2-dimensional conductor having a 2-dimensional array of scattering site formed thereon, and having proximal gate electrodes located in the channel regions between the scattering sites and wherein the device is configured to enable independent modulation of gates.

36. A device as claimed in claim 35 wherein the conductor comprises graphene.

37. A device as claimed in claim 1 wherein the conducting material continues unbroken through both of the scattering sites to first and second regions outside the channel region and separated by the channel region.

38. A phase controllable field effect transistor device switchable between on and off states, the device comprising:
   a conductor formed from a conducting material and having a channel region defined between at least two scattering sites, the scattering sites being separated from one another by a distance less than the electron wave function coherence length of the conducting material,
   a gate provided proximal to the channel region and configured to operably provide a bias voltage to the channel region to modulate a scattering phase of electrons within the channel region such that the zero bias conductance of the device may be modulated to switch the device between the off and on states, and
   wherein at least one of the scattering sites is an active scatter whose properties may be biased independently of a bias applied to the channel region.

39. The device of claim 38 wherein the active scatter is configured to enable tuning of the energy levels therein.

40. The device of claim 39 wherein the active scatter has magnetic properties.

41. The device of claim 39 wherein the active scatterer is responsive to an external bias or gate to effect changes in the transmissivity of the active scatterer.

42. The device of claim 41 wherein a tuning of the device may be effected through application of a gating signal to one or both of the conducting channel and the active scatterer.

* * * * *